Dec. 10, 1957

H. C. GOODRICH

FREQUENCY CONVERTER

Filed Oct. 31, 1950

2,816,220

Inventor

Hunter C. Goodrich

By H. W. Newton

Attorney

United States Patent Office 2,816,220

Patented Dec. 10, 1957

2,816,220

FREQUENCY CONVERTER

Hunter C. Goodrich, Collingswood, N. J., assignor to Radio Corporation of America, a corporation of Delaware Application October 31, 1950, Serial No. 193,095

4 Claims. (Cl. 250—20)

This invention relates to frequency converters and more particularly to a frequency converter circuit including a semi-conductor device for developing a sinusoidal wave and mixing it with an impressed modulated carrier wave to provide an amplified carrier wave of intermediate frequency.

Frequency converters are well known in the art. They are used, for example, in superheterodyne receivers for converting a received modulated carrier wave into a corresponding intermediate frequency wave. A frequency converter of the type referred to, generally includes an oscillator for developing the beat frequency wave and a mixer, for mixing the locally developed oscillatory wave with the received carrier wave. A conventional frequency converter may include a separate electron discharge tube for developing the beat frequency wave and another electron discharge tube for mixing the received wave with the locally developed wave. Alternatively, a frequency converter may consist of a single electron discharge tube which may be a pentagrid tube having an oscillator section which is electronically coupled to the mixer section of the tube. In accordance with the present invention, a frequency converter is provided which includes a single semi-conductor device of the type which is usually called a transistor.

It is accordingly an object of the present invention to provide an improved and simplified frequency converter for developing an oscillatory wave and mixing it with an impressed modulated carrier wave to develop an amplified carrier wave of an intermediate or beat frequency, which includes a single three-electrode semi-conductor device.

A further object of the invention is to provide a frequency converter of the type described wherein the oscillatory wave is developed without utilizing an external feedback path and which has a good voltage gain of the carrier wave to be converted.

Another object of the invention is to provide a semi-conductor frequency converter wherein an external feedback path is utilized to develop the oscillatory wave and which has a substantial conversion power gain.

A frequency converter in accordance with the present invention comprises a semi-conductor device of the transistor type having a base, an emitter and a collector. Suitable operating potentials are applied to the electrodes of the device, and the modulated carrier wave to be converted is impressed on the emitter electrode. A resonant circuit for developing an oscillatory wave is effectively coupled to emitter and collector. Another resonant circuit tuned to the desired intermediate frequency is coupled to the collector electrode and the amplified intermediate-frequency wave may be derived therefrom.

The resonant circuit in which the oscillatory wave is developed may, for example, be connected between base and ground. In that case, the resonant circuit is, of course, effectively coupled to both emitter and collector electrodes. It is also feasible to provide a feedback path between an intermediate point of the parallel resonant circuit and the emitter. In order to develop an oscillatory wave in the parallel resonant circuit, it is necessary that the external impedance elements between emitter and ground and collector and ground present a small impedance to the oscillatory wave.

Alternatively, the resonant circuit wherein the oscillatory wave is developed, may be connected between collector and ground, and an intermediate point of the resonant circuit may be connected to the emitter to provide the required feedback path.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 3:
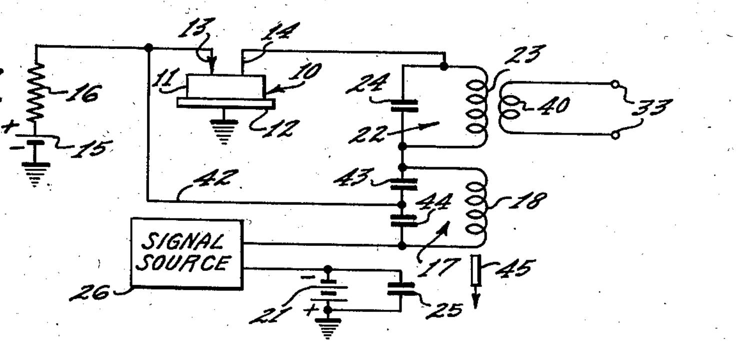
Figure 4:
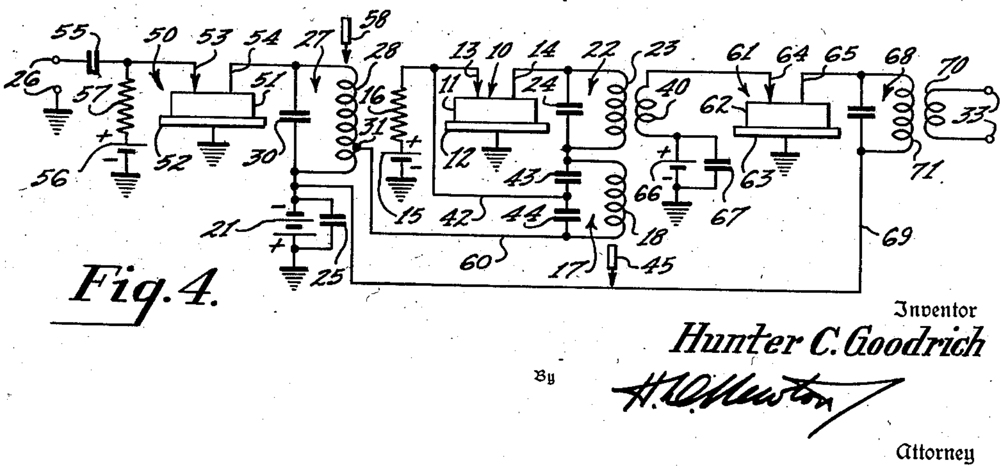

Figure 3 is a circuit diagram of a frequency converter in accordance with the invention wherein an external feedback path is provided for the oscillatory circuit; and Figure 4 is a circuit diagram of a signal converting a mixing system comprising a radio-frequency amplifier stage, a converter stage and an intermediate-frequency amplifier stage all of the transistor type arranged in accordance with the present invention.

Figure 1:
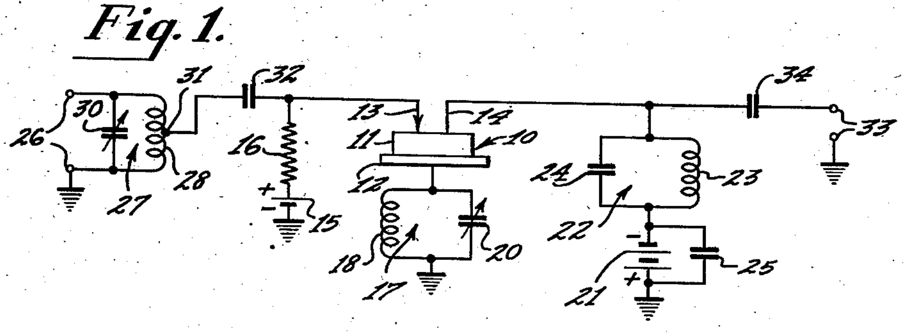
Figure 1 is a circuit diagram of a frequency converter embodying the present invention and having a parallel resonant circuit connected between base and ground.

Referring now to the drawing, in which like components have been designated by the same reference numerals throughout the figures, and particularly to Figure 1 there is illustrated a frequency converter comprising a semi-conductor device 10. Device 10 includes a semi-conducting body 11 which may, for example, consist of silicon or preferably of germanium. Body 11 may be of the P type but preferably is of the N type. Base electrode 12, emitter electrode 13 and collector electrode 14 are provided in contact with body 11. Base electrode 12 is in low-resistance contact with body 11 and may, for example, consist of a suitable slab of metal which may be soldered or sweated to body 11. Emitter 13 and collector 14 are in rectifying contact with body 11 and may, for example, consist of point or line contact electrodes. Emitter 13 and collector 14 preferably are disposed closely adjacent to each other and may have a distance of approximately 2 mils or more depending on the electrical treatment of the device.

As is conventional practice a voltage in the forward direction is applied between emitter 13 and base 12 and a voltage in the reverse direction is applied between collector 14 and base 12. If body 11 is of the N type, the emitter 13 should be positive and the collector 14 negative, both with respect to the base 12. However, if body 11 should be of the P type, the potentials must be reversed. For the purpose of applying a voltage in the forward direction between emitter 13 and base 12 there may be provided a source of voltage such as battery 15 having its negative terminal grounded. The positive terminal of battery 15 is connected to emitter 13 through resistor 16. Base electrode 12 is grounded through parallel resonant circuit 17 including inductor 18 and capacitor 20 connected in parallel. Capacitor 20 may be variable as shown to vary the resonant frequency of circuit 17.

For the purpose of applying a voltage in the reverse direction between collector 14 and base 12, there may be provided a source of voltage such as battery 21 having its positive terminal grounded. The negative terminal of battery 21 is connected to collector 14 through parallel resonant circuit 22 including inductor 23 and capacitor 24.

Battery 21 may be bypassed for alternating-frequency currents by bypass capacitor 25.

A modulated carrier wave may be impressed on input terminals 26. Thus if the frequency converter of the invention is used in a superheterodyne radio receiver, input terminal 26 may be connected to the antenna or to the radio-frequency amplifier of the receiver. Parallel resonant circuit 27 is connected across input terminals 26 and includes inductor 28 and capacitor 30 which may be variable as shown. Parallel resonant circuit 27 accordingly may be tuned to the frequency of a modulated carrier wave to be received. Input resonant circuit 27 is coupled to emitter electrode 13. This may be effected by connecting tap 31 on inductor 28 to emitter 13 through coupling capacitor 32. In this manner, the comparatively low impedance which appears looking into emitter electrode 13 may be matched to the higher impedance of a parallel resonant input circuit 27.

Resonant circuit 17 is tuned to a frequency different from that to which input circuit 27 is tuned. The oscillatory wave which beats with the received modulated carrier wave is developed in resonant circuit 17. Accordingly, the resonant frequency of circuit 17 should be variable to develop the desired intermediate-frequency wave which should have a constant frequency regardless of the frequency of the received carrier wave.

Collector or output circuit 22 is tuned to the desired intermediate frequency which may be either the sum or the difference of the frequencies of the received carrier wave and of the oscillatory wave, as is well known. The amplified intermediate-frequency wave may be derived across collector circuit 22 by means of output terminals 33 one of which is grounded while the other one is coupled to collector 14 by coupling capacitor 34.

The frequency converter circuit of Figure 1 operates in the following manner. The copending application to Eberhard, Serial No. 73,352, filed on January 28, 1949, now abandoned, entitled "Sine Wave Oscillators," and assigned to the assignee of this application discloses a two-terminal sine wave oscillator having a parallel resonant circuit connected between the base and ground. It has been explained in the Eberhard application that such a circuit will oscillate in view of the internal negative resistance which appears looking into the base electrode. This negative resistance is controlled by the voltage developed across parallel resonant circuit 17. It is an essential condition for the operation of this oscillator that the external impedance between base 12 and ground be high. This condition is satisfied by the parallel resonant circuit 17.

Furthermore, the external impedances between emitter 13 and ground and between collector 14 and ground must be low for the oscillatory wave. Accordingly, the path from emitter 13 through coupling capacitor 32, tap 31 and the lower portion of inductor 38 to ground must have a low impedance for the oscillatory wave. Consequently, the impedance of capacitor 32 to a wave at the oscillatory frequency should be small. Preferably, the impedance of capacitor 32 to the received carrier wave should also be low. For the same reason the impedance of the lower portion of inductor 28 below tap 31 should be low for the oscillatory wave developed in circuit 17. This condition will, of course, always be satisfied because the frequency to which resonant circuit 27 is tuned is different from that of the oscillatory wave. The resistance of resistor 16 preferably is large compared to the impedance of the signal source 27 so that the impressed carrier wave will not be shunted through resistor 16 and battery 15.

The impedance of parallel resonant circuit 22 tuned to the intermediate frequency will also be low for the oscillatory wave. Capacitor 25, of course, functions as a bypass capacitor for the oscillatory wave. Accordingly, it will be seen that the necessary conditions for the operation of a two-terminal sine wave oscillator are met. The oscillatory wave developed in this manner in parallel resonant circuit 17 will also appear at the collector 14. It will be understood that oscillator tank circuit 17 is effectively coupled to emitter 13 and collector 14.

The impressed modulated carrier wave and the fed back oscillatory wave both appear at the emitter 13 where they are mixed. This is due to the fact that the emitter voltage-collector current relationship is non-linear in semi-conductor device 10. This non-linearity of the voltage-current relationship is particularly pronounced in view of the relatively large oscillatory wave developed.

Accordingly, waves having a frequency corresponding to the sum and the difference of the carrier wave frequency and of the oscillatory wave frequency are amplified and developed at the collector 14 which have an amplitude essentially proportioned to the amplitude of the impressed carrier wave. The output circuit 22 is tuned either to the sum or to the difference frequency which is the desired intermediate frequency. The thus obtained intermediate-frequency wave is amplified, and a voltage gain of about 10 has been obtained with the circuit of Figure 1. It is to be understood, of course, that the intermediate frequency to which resonant circuit 22 is tuned should be outside of the range to which the oscillator circuit 17 may be tuned so that the impedance of circuit 22 will always be low for the oscillatory wave.

Figure 2:
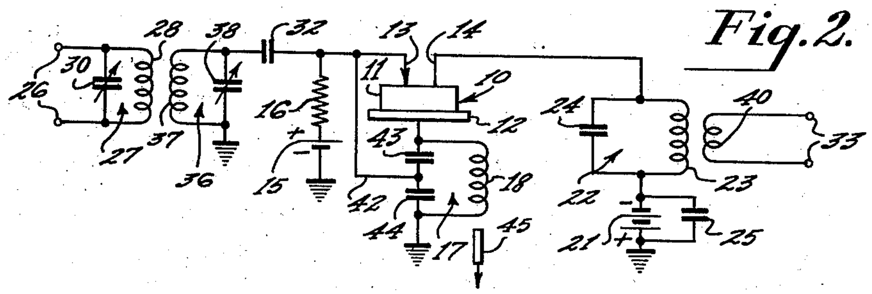
Figure 2 is a circuit diagram of a modification further in accordance with the invention of the frequency converter of Figure 1.

Referring now to Figure 2, there is illustrated a modification of the frequency converter of Figure 1. Thus the input circuit for the modulated carrier wave has been slightly modified. The carrier wave is again impressed on input terminals 26 and developed in input circuit 27. Emitter circuit 36 which may be a parallel resonant circuit includes inductor 37 and capacitor 38 which may be variable as shown. Inductors 28 and 37 are inductively coupled. Preferably the impedance of emitter circuit 36 matches that of emitter electrode 13. In other words, the impedance of input circuit 27 is stepped down by emitter circuit 36. The modulated carrier wave is again impressed through coupling capacitor 32 on emitter 13.

The output signal may be obtained from output inductor 40 inductively coupled to inductor 23 of the collector circuit 22. Output terminals 33 are connected across output inductor 40.

The oscillator circuit of the frequency converter of Figure 2 includes an external connection 42 between emitter electrode 13 and an intermediate point of oscillator circuit 17. To this end, a pair of capacitors 43 and 44 may be connected across inductor 18, and their junction point may be connected to emitter 13 by lead 42. It is, of course, also feasible to connect a suitable tap on inductor 18 to emitter 13 through a blocking capacitor so as to prevent short-circuiting of battery 15. Parallel resonant circuit 17 preferably is tuned by a movable core indicated at 45.

The frequency converter of Figure 2 operates in essentially the same manner as that of Figure 1. Capacitors 43 and 44 may be considered a voltage divider so that a portion of the voltage developed in resonant circuit 17 is fed back through lead 42 to emitter electrode 13 thereby to match the impedance of resonant circuit 17 to that of the emitter 13.

The impedance of emitter input circuit 36 should again be low for the oscillatory wave developed in circuit 17 so that the impedance between emitter 13 and ground will be low for the oscillatory wave. The feedback connection 42 promotes oscillations of the circuit.

Another frequency converter in accordance with the present invention has been illustrated in Figure 3. Here the oscillator tank circuit 17 is connected between collector 14 and ground, and an intermediate point thereof is connected to emitter electrode 13 through feedback path 42. Accordingly, the intermediate-frequency output circuit 22 and the oscillator circuit 17 are connected in series between collector 14 and battery 21 or ground. Signal source 26, that is, a source of a modulated carrier wave may be provided between oscillator tank 17 and battery 21. Base electrode 12 may be grounded as shown.

The frequency converter of Figure 3 comprises an oscillator circuit. Thus, tank circuit 17 is effectively connected between collector 14 and ground, that is, the base electrode. An intermediate point of the oscillator tank circuit 17 is connected through feedback path 42 to emitter 13. Preferably the oscillator tank circuit 17 comprises again a pair of capacitors 43 and 44, the junction point of which is connected to the emitter 13. This circuit accordingly oscillates by virtue of the feedback between emitter 13 and collector 14. Capacitors 43 and 44 again represent a voltage divider whereby a predetermined portion of the oscillatory energy is fed back to emitter 13. The intermediate-frequency collector circuit 22 represents a low-impedance for the oscillatory wave.

The resistance of resistor 16 should again be large compared to the impedance of signal source 26. Furthermore, the impedance which capacitor 44 presents to either the modulated carrier wave or to the oscillatory wave should be small compared to the impedance which appears looking into emitter electrode 13. The impedance of signal source 26 should be low for the oscillatory wave. Accordingly tank circuit 17 is effectively connected between collector 14 and ground for the oscillatory wave.

The modulated carrier wave developed by source 26 is impressed on emitter electrode 13 through capacitor 44 and feedback path 42, the capacitor serving as a coupling capacitor. Accordingly, the capacitance of capacitor 44 should be large compared to that of capacitor 43 so that capacitor 44 presents a low impedance to the modulated carrier wave. Of course, a small portion of the modulated carrier wave will also be impressed directly on collector 14. The modulated carrier wave and the locally developed oscillatory wave again are mixed at the emitter 13, and the amplified beat-frequency or intermediate-frequency wave is derived from collector circuit 22. The oscillator tank circuit 17 presents a low impedance to the intermediate-frequency wave so that collector circuit 22 is effectively grounded through tank circuit 17 and signal source 26.

The circuit of Figure 3 has given excellent results and a substantial conversion power gain was obtained with an output load of approximately 300 ohms on the output circuit 33.

Figure 4 to which reference is now made, illustrates a radio-frequency amplifier, a frequency converter and an intermediate-frequency amplifier connected in cascade. The radio-frequency amplifier includes semi-conductor device 50 having a semi-conducting body 51 and a base electrode 52, an emitter electrode 53 and a collector electrode 54 in contact with body 51. Base electrode 52 may be grounded as shown. A radio-frequency carrier wave which may, for example, be picked up by an antenna may be impressed on input terminals 26. One of the input terminals is coupled to emitter electrode 53 through coupling capacitor 55. Battery 56 has its positive terminal connected to emitter 53 through resistor 57 while the negative terminal of battery 56 is grounded. Battery 21 is connected to collector 54 through resonant circuit 27 which is tuned to the radio frequency. Inductor 28 may be tuned by a core indicated at 58.

Radio-frequency amplifier stage 50 operates in a conventional manner. The modulated carrier wave is impressed on the emitter 53 and an amplified carrier wave is obtained from the output circuit 27. This amplified carrier wave is impressed on frequency converter stage 10. To this end a tap 31 on inductor 28 is connected by lead 60 to parallel resonant circuit 17 which is tuned to the oscillator frequency. At the same time, the collector voltage is impressed on collector 14 through battery 21, the lower portion of inductor 28, tap 31, lead 60 and inductors 18 and 23. The frequency converter stage 10 is otherwise identical with that shown in Figure 3.

The amplified intermediate-frequency wave may be obtained from output coil 40 inductively coupled to inductor 23 of collector circuit 22. This amplified intermediate-frequency wave is now impressed on an intermediate-frequency amplifier including semiconducting device 61 having a semi-conducting body 62 provided with a base electrode 63, an emitter electrode 64, and a collector electrode 65. Emitter battery 66 is connected between ground and emitter 64 through inductor 40. Battery 66 may be bypassed for alternating-frequency currents by capacitor 67. Resonant circuit 68 may be connected between collector 65 and the negative terminal of battery 21 through lead 69. Inductor 70 inductively coupled to inductor 71 of resonant circuit 68 may be used for developing the amplified intermediate-frequency wave which may then be obtained from output terminals 33.

It is to be understood that tap 31 on inductor 28 serves the purpose to match the output impedance of device 50 to the input impedance of device 10 which may be of the order of 300 ohms. In the same manner inductor 40 matches the impedance of emitter 64 to that of collector 14 connected to resonant circuit 22. The frequency converter of Figure 4 operates in the same manner as that of Figure 3. The amplifier stages 50 and 61 operate in a conventional manner and have emitter input and collector output.

There has thus been disclosed a frequency converter which utilizes a semi-conductor device. The oscillator portion of the frequency converter may have an external feedback path or alternatively it may simply consist of a parallel resonant circuit connected between base and ground. The frequency converter of the invention has a substantial conversion power gain and is of simple construction, it requires but a single semi-conductor device having three electrodes.

What is claimed is:

1. A frequency converter comprising a semi-conductor device including a semi-conducting body, a base electrode, an emitter electrode and a collector electrode in contact with said body, means for applying operating voltages to said electrodes, a source of modulated carrier waves, a first resonant circuit, a second resonant circuit, said source, said first resonant circuit and said second resonant circuit being connected effectively in series between said base electrode and said collector electrode, a feedback connection between an intermediate point of said first resonant circuit and said emitter electrode, the path between said source and said emitter electrode presenting a low impedance to said carrier wave, means selecting a carrier wave having a predetermined frequency, said first resonant circuit being tuned to a frequency different from said predetermined frequency, whereby an oscillatory wave is developed in said first resonant circuit, said second resonant circuit being tuned to a predetermined intermediate frequency obtained by mixing said carrier wave with said oscillatory wave, and an output circuit coupled to said second resonant circuit for deriving an amplified output wave at said intermediate frequency.

2. A frequency converter comprising a semi-conductor device including a semi-conducting body, a base electrode, an emitter electrode and a collector electrode in contact with said body, means for applying a voltage in the forward direction between said emitter and base electrodes and for applying a voltage in the reverse direction between said collector and base electrodes, a source of modulated carrier waves, a first parallel resonant circuit comprising an inductor shunted by a pair of capacitors, a second parallel resonant circuit, said source, said first resonant circuit and said second resonant circuit being connected in series between said base electrode and said collector electrode, a feedback connection between the junction point of said pair of capacitors of said first resonant circuit and said emitter electrode, the path between said source and said emitter electrode including one of said pair of capacitors presenting a low impedance to said carrier wave, means selecting a carrier wave having a predetermined frequency, said first resonant circuit being tuned to a frequency different from said predetermined frequency, whereby an oscillatory wave is developed in said first resonant circuit, said second resonant circuit being tuned to a predetermined intermediate frequency obtained by mixing said carrier wave with said oscillatory wave, and an output circuit coupled to said second resonant circuit for deriving an amplified output wave at said intermediate frequency.

3. A frequency converter comprising a semi-conductor device including a semi-conducting body, a base electrode, an emitter electrode and a collector electrode in contact with said body, means for applying a voltage in the forward direction between said emitter and base electrodes and for applying a voltage in the reverse direction between said collector and base electrodes, a source of modulated carrier waves, a first parallel resonant circuit including an inductor shunted by a first and second capacitor converted in series, a second parallel resonant circuit, said source, said first capacitor and said second capacitor of said first resonant circuit and said second resonant circuit being connected in series between said base electrode and said collector electrode, a feedback connection between the junction point of said capacitor and said emitter electrode, means selecting a carrier wave having a predetermined frequency, said first resonant circuit being tuned to a frequency different from said predetermined frequency, whereby an oscillatory wave is developed in said first resonant circuit, said first capacitor presenting a low impedance to said carrier wave and to said oscillatory wave, said second resonant circuit being tuned to a predetermined intermediate frequency obtained by mixing said carrier wave with said oscillatory wave, and an output circuit coupled to said second resonant circuit for deriving an amplified output wave at said intermediate frequency.

4. A frequency converter comprising a semi-conductor device including a semi-conducting body, a base electrode, an emitter electrode and a collector electrode in contact with said body, means for applying a voltage in the forward direction between said emitter and base electrodes and for applying a voltage in the reverse direction between said collector and base electrodes, a first parallel resonant circuit, means for impressing a modulated carrier wave of predetermined frequency on said resonant circuit, a second parallel resonant circuit including an inductor shunted by a first and a second capacitor connected in series, a third parallel resonant circuit, a connection between an intermediate point of said first resonant circuit and said first capacitor of said second resonant circuit, one terminal of said first resonant circuit, said connection, said first and second capacitors of said second resonant circuit and said third resonant circuit being connected in series between said base electrode and said collector electrode, a feedback connection between the junction point of said capacitors and said emitter electrode, said second resonant circuit being tuned to a frequency different from said predetermined frequency, whereby an oscillatory wave is developed in said second resonant circuit, said first capacitor presenting a low impedance to said carrier wave and to said oscillatory wave, said third resonant circuit being tuned to a predetermined intermediate frequency obtained by mixing said carrier wave with said oscillatory wave, and an output circuit coupled to said third resonant circuit for deriving an amplified output wave at said intermediate frequency.

References Cited in the file of this patent

UNITED STATES PATENTS

| | | |
|---|---|---|
| 2,151,800 | Rocard | Mar. 28, 1939 |
| 2,315,658 | Roberts | Apr. 6, 1943 |
| 2,432,183 | Van Slooten | Dec. 9, 1947 |
| 2,543,067 | Sanders | Feb. 27, 1951 |
| 2,570,436 | Eberhard | Oct. 9, 1951 |
| 2,647,957 | Mallinckrodt | Aug. 4, 1953 |
| 2,713,117 | Haegele | July 12, 1955 |

FOREIGN PATENTS

| | | |
|---|---|---|
| 740,371 | Germany | Oct. 19, 1943 |

OTHER REFERENCES

Radio Craft, September 1948, pp. 24, 25.
RCA Review, March 1949, pp. 5–16.